United States Patent [19]

Beckerman et al.

[11] 4,250,495
[45] Feb. 10, 1981

[54] TOUCH SENSITIVE CONTROL PANEL AND A METHOD OF MANUFACTURE THEREOF

[75] Inventors: Howard L. Beckerman, Red Bank; Allan M. Dob, Clifton, both of N.J.

[73] Assignee: The Singer Company, Stamford, Conn.

[21] Appl. No.: 95,115

[22] Filed: Nov. 16, 1979

[51] Int. Cl.³ .................. G08C 1/00; H01H 9/26; B41J 5/08; H02B 1/04
[52] U.S. Cl. .................. 340/365 C; 29/622; 179/90 K; 200/5 A; 340/711; 361/181
[58] Field of Search .......... 200/5 A, DIG. 1, 159 B; 29/622; 340/365 C, 365 R, 711; 179/90 K; 307/116; 361/181; 364/708, 712; 235/145 A

[56] References Cited

U.S. PATENT DOCUMENTS

| | | |
|---|---|---|
| 3,200,375 | 8/1965 | Lutz . |
| 3,492,440 | 1/1970 | Cerbone et al. ............. 179/90 K |
| 3,701,869 | 10/1972 | Jacob et al. ................ 340/365 C |
| 3,757,322 | 9/1973 | Barkan et al. .............. 340/365 C |
| 3,777,222 | 12/1973 | Harris . |
| 3,789,167 | 1/1974 | Seeger, Jr. et al. ......... 200/5 A |
| 3,964,594 | 6/1976 | Gabbrielli et al. .......... 340/365 R |
| 3,971,013 | 7/1976 | Challoner et al. .......... 340/365 C |
| 3,974,472 | 8/1976 | Gould, Jr. .................. 340/365 C |
| 3,983,553 | 9/1976 | Kesling ...................... 340/365 R |
| 4,017,848 | 4/1977 | Tannas, Jr. ................. 340/365 R |
| 4,056,699 | 11/1977 | Jordan ....................... 200/5 A |
| 4,090,092 | 5/1978 | Serrano ..................... 340/365 R |
| 4,104,728 | 8/1978 | Kasubuchi ................. 200/5 A |
| 4,121,204 | 10/1978 | Welch et al. ............... 200/5 A |
| 4,143,253 | 3/1979 | Wagner et al. ............. 200/5 A |

Primary Examiner—Thomas A. Robinson
Attorney, Agent, or Firm—David L. Davis; Robert E. Smith; Edward L. Bell

[57] ABSTRACT

A touch sensitive control panel is disclosed which is constructed of a support surface and a graphic display member secured thereto. The support surface has regions of conductive material deposited thereon and the graphic display member has functional indicia printed thereon, there being a layer of adhesive intermediate the graphic display member and the support surface to secure the graphic display member to the support surface with the functional indicia in registration with the conductive material regions. The graphic display member and the adhesive layer form a dielectric medium between the conductive material and a body portion of an operator touching the front surface of the graphic display member. An improved method for manufacturing such a touch panel is also disclosed.

13 Claims, 8 Drawing Figures

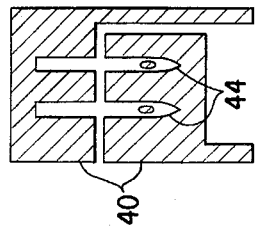
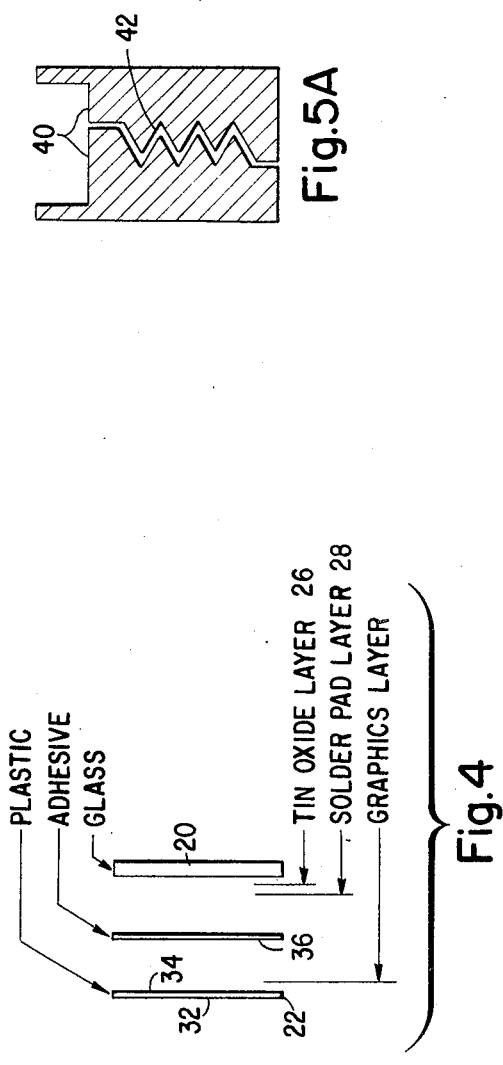
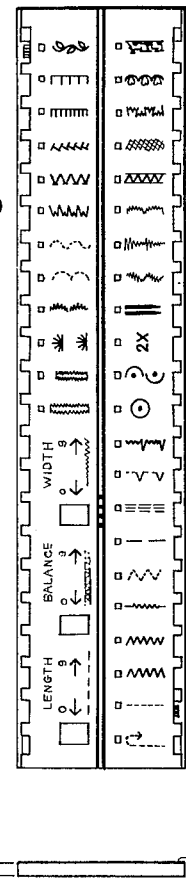
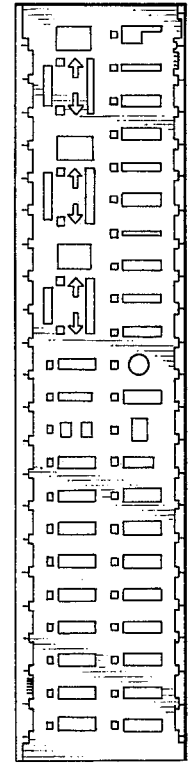

TOUCH SENSITIVE CONTROL PANEL AND A METHOD OF MANUFACTURE THEREOF

BACKGROUND OF THE INVENTION

This invention relates to control panels for appliances and the like and, more particularly, to an improved construction of a touch sensitive control panel which provides capacitive coupling between a body portion of an operator touching the control panel and a conductive region.

Many domestic appliances, such as, for example, sewing machines, microwave ovens, televisions, etc., are presently constructed with touch sensitive control panels. Such control panels typically respond to the capacitive effect of a user's touch for both controlling the operation of the appliance and for providing visual feedback to the operator of such operation. These control panels have been typically constructed of a continuous planar element such as a glass panel to which circuitry and functional indicia are applied as by deposition or the like. A problem with such a control panel is that it is relatively expensive to manufacture, the application of circuitry and functional indicia to a glass panel being a time consuming, multistep process.

It is therefore a primary object of this invention to provide a control panel of the type having a plurality of touch sensitive areas in proximate relationship to corresponding functional indicia which is of economical construction.

A further problem associated with glass touch panels is their susceptibility to deterioration from chemical solvents and the like which may be applied thereto during, for example, the cleaning of the control panel.

It is therefore another object of this invention to provide a construction for a control panel which provides for durability and resistance to chemical solvents.

SUMMARY OF THE INVENTION

The foregoing and additional objects are attained in accordance with the principles of this invention by providing a control panel of the type having a plurality of touch sensitive areas in proximate relationship to corresponding functional indicia and which includes a nonconductive support member having a surface with a plurality of regions of conductive material arranged on the support surface, along with means for providing electrical connections to the plurality of conductive material regions. There is further provided an optically transparent graphic display member having a front surface and a rear surface, the rear surface having the functional indicia printed thereon in nonconductive material, the rear surface of the graphic display member being adhesively secured to the support surface with the functional indicia in registration with the conductive material regions. The graphic display member and the adhesive which secures the graphic display member to the support surface forms a dielectric medium in contact with the conductive material regions so as to provide capacitive coupling between selective ones of the conductive material regions and a body portion of an operator touching the front surface of the graphic display member in an area having an overlying relationship to a selected one of the functional indicia visible through the graphic display member.

In accordance with an aspect of this invention, the graphic display member is formed of a flexible sheet of polycarbonate plastic.

In accordance with another aspect of this invention, there is provided a unique method for manufacturing the control panel. This method involves applying to a support surface only regions of conductive material and printing all functional indicia on a separate graphic display member which is then adhesively secured to the support surface.

In accordance with an aspect of this invention, the graphic display member is provided from a roll of flexible polycarbonate plastic and the printing thereon utilizes a continuous printing process to print a multiple number of graphic display members from the roll and then separating the printed roll into individual graphic display members.

BRIEF DESCRIPTION OF THE DRAWINGS

The foregoing will be more readily apparent upon reading the following description in conjunction with the drawings wherein:

FIGS. 2A, 2B and 2C, respectively, show, rear, end and front views of a prior art touch control panel such as that utilized in the sewing machine shown in FIG. 1;

FIG. 4 is a disassembled end view of a control panel constructed in accordance with the principles of this invention; and FIGS. 5A and 5B illustrate a variation of a control panel constructed in accordance with the principles of this invention.

DETAILED DESCRIPTION

Figure 1:
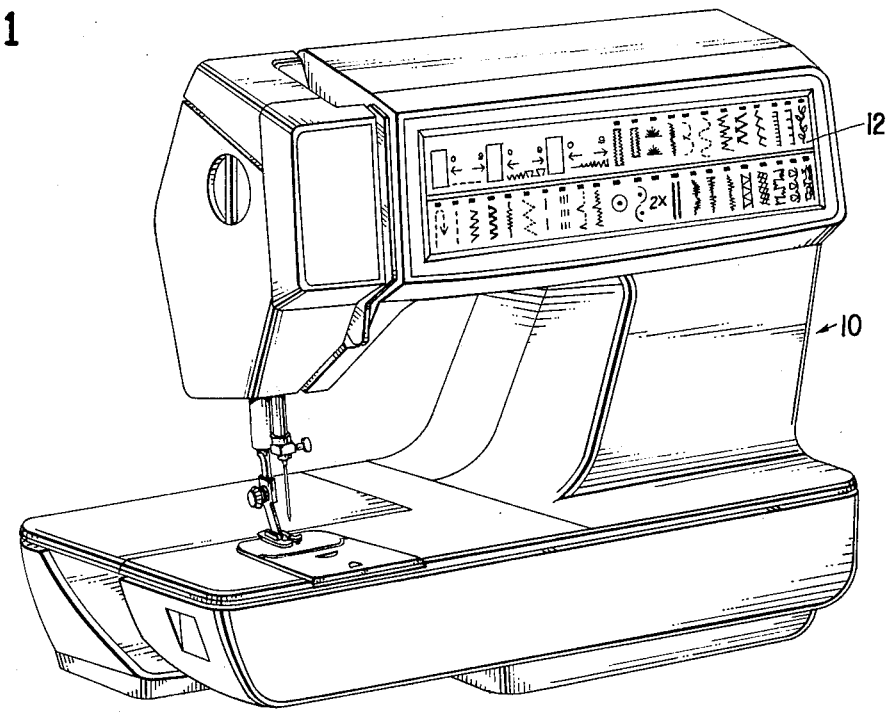
FIG. 1 is a perspective view of a sewing machine having a touch control panel of the type to which the present invention relates.

Referring now to the drawings, wherein like elements in different figures thereof have the same reference character applied thereto, FIG. 1 illustrates a sewing machine indicated generally at 10 having a control panel 12 of the type to which this invention relates. Typically, a prior art version of the control panel 12 utilizes a continuous planar element such as a glass panel to which circuitry is applied as by deposition or the like to provide controls sensitive to the touch of an operator's finger. Visible on the panel 12 are functional indicia and in proximate relation thereto, although not visible in FIG. 1, are touch sensitive areas which provide means for sensing an operator's touch due to a change in capacitance. The control panel 12 is back lit and presents a "dead front" when not lit.

FIGS. 2A, 2B and 2C depict the rear, end and front views, respectively, of a conventional glass control panel 12. The control panel 12 is a planar glass panel upon which are deposited a multiplicity of layers of material on both sides thereof, with layers 1 through 4 being deposited on the front surface and layers 5 through 12 being deposited on the rear surface. Layer 1 is a layer of tin oxide, which is a transparent conductive material. The tin oxide is deposited in regions in proximate relationship to the visible functional indicia, so that, as is well known, the touch of an operator's finger on the front surface of the panel 12 near one of the functional indicia will cause a capacitive effect to occur between the operator's finger and the conductive region (or regions) proximate that functional indicia. Layer 2 is the accent stripe extending the length of the control panel 12 and layer 3 comprises solder pads for connecting the regions of conductive material (layer 1) to electrical touch sensing circuitry. Layer 4 is a glaze layer which forms a dielectric medium between layer 1 and the body portion of an operator touching the front surface of the control panel 12.

On the rear surface of the control panel 12, layer 5 is a layer of the main graphic gray and layer 6 is a backup gray layer. Layers 7, 8, 9 and 10 are different color filters, layer 11 is a layer of reflector white, and layer 12 is a layer of defuser lalique.

Thus, to apply the 12 layers of material to the glass panel a multistep process is required. In particular, some of the steps for applying the graphics require silk screen printing, a costly and time consuming process.

Figure 3:
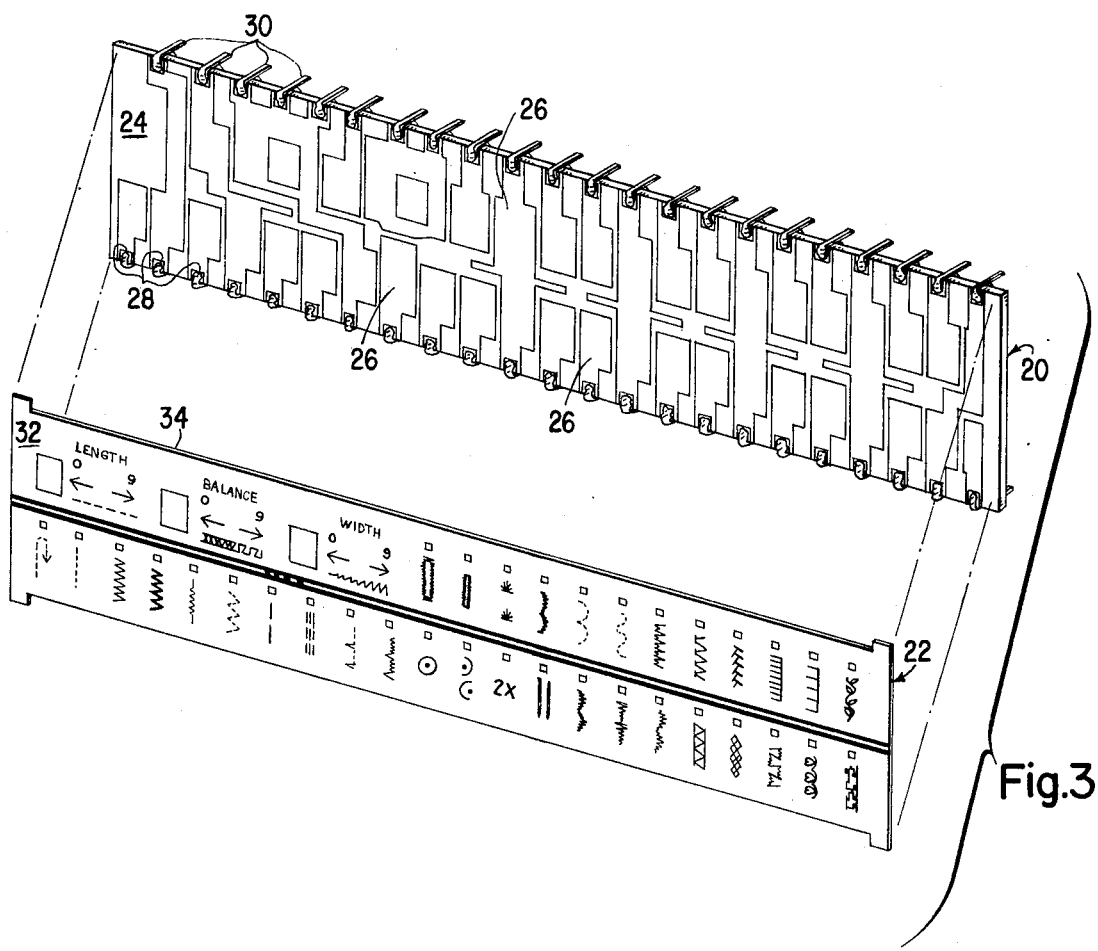
FIG. 3 is a disassembled perspective view of an improved touch control panel constructed in accordance with the principles of this invention.

Referring now to FIGS. 3 and 4, shown therein is an improved control panel of the dead front back lit type constructed in accordance with the principles of this invention. The improved control panel includes a support member 20 and a graphic display member 22. Illustratively, the support member 20 is a planar glass panel. However, it is contemplated that any non-conductive optically transparent material such as, for example, plastic, may be utilized as the support member 20. The support member 20 has a surface 24 upon which are arranged a plurality of regions of optically transparent conductive material 26. Illustratively, the material 26 is tin oxide which is deposited on the surface 24 by a conventional vacuum deposition technique, or the like. A plurality of solder pads 28 are then arranged along the edges of the support member 20 over the conductive material 26 and a plurality of pins 30 are then soldered thereto so as to provide for electrical connections from the conductive material 26 to appropriate circuitry.

The graphic display member 22 has a front surface 32 and a rear surface 34, the rear surface 34 having the functional indicia printed thereon in translucent non-conductive material. Preferably, the graphic display member 22 is an optically transparent flexible plastic material. In accordance with a preferred embodiment of this invention, the graphic display member 22 is formed of polycarbonate plastic with the front surface 32 having a velvetized texture. The velvetized texture on the front surface enhances the "dead front" appearance of the control panel. To secure the graphic display member 22 to the support member 20, there is provided a layer of adhesive material 36 intermediate the rear surface 34 of the graphic display member 22 and the support surface 24.

The graphic display member 22 and the adhesive layer 36 form a dielectric medium in contact with the conductive material 26 so as to provide capacitive coupling between a body portion of an operator touching the front surface 32 and the conductive material 26. The operator will touch the front surface 32 in an area having an overlying relationship to a selected one of the functional indicia visible through the graphic display member 22 in order to select a desired function for the appliance. Preferably, the dielectric medium formed by the graphic display member 22 and the adhesive layer 36 has a dielectric constant in the range from about 3.6 to about 4 and the combined thickness of the graphic display member 22 and the adhesive layer 36 is about 0.006 inch, with the graphic display member 22 having a thickness of about 0.005 inch and the adhesive layer 36 having a thickness of about 0.001 inch.

FIGS. 5A and 5B illustrate a variation of the aforedescribed control panel wherein the regions of conductive material are optically opaque and it is still desired to have a backlit display. As shown in FIGS. 5A and 5B, the conductive regions 40 have the pattern functional indicia 42, 44 printed thereon as regions where the opaque conductive material is removed. The support member would be optically translucent and the plastic film would be a protective member that would be printed with areas of desired colors for the indicia.

Alternatively, the control panel according to this invention need not be of the backlit variety. In such case, the regions of conductive material on the support surface could be optically opaque. For example, copper foil could be used.

A preferred method of manufacturing the control panel first described above, is to first provide a support member 20 of non-conductive optically transparent material. The support member will have a surface 24. Next, a plurality of regions of optically transparent conductive material 26 are deposited on the support surface 24. Electrical connections to the plurality of conductive material regions 26 are then provided. An optically transparent graphic display member 22 having a front surface and a rear surface is also provided. The functional indicia are then printed in non-conductive material on the rear surface of the graphic display member 22 and a layer of pressure sensitive adhesive material 36 is applied thereover. The graphic display member 22 is then placed over the support surface 24 with the functional indicia in registration with the conductive material regions 26 and with the adhesive layer 36 intermediate the graphic display member 22 and the support surface 24. Finally, pressure is applied between the front surface 32 of the graphic display member 22 and the support surface 24 so as to adhere the graphic display member 22 to the support member 20. An intermediate stop is to harden the adhesive material 36 after it has been applied to the graphic display member 22 to substantially eliminate any tackiness thereof so it may be positioned on the support surface 24. This hardening step may be accomplished by lowering the temperature of the graphic display member 22. After the display member 22 is appropriately registered on the support surface 24, the adhesive material 36 is then softened. This softening may be accomplished by raising the temperature of the graphic display member 22.

To manufacture the control panel variations described above, the described process must be slightly modified to change the materials used and where the functional indicia are printed. However, the overall process is basically unchanged.

As described above, one of the problems with the prior art control panel shown in FIGS. 2A, 2B and 2C, is that the printing process is a costly multistep process. In accordance with the principles of this invention, significant cost reductions are attained by utilizing a continuous printing process to print the functional indicia on the rear surface 34 of the graphic display member 22. Thus, a roll of flexible polycarbonate plastic may be provided and a continuous printing process may be utilized to print a multiple number of graphic display members from the roll. The printed roll is then separated into individual graphic display members.

The aforedescribed control panel construction and method of manufacturing same possesses certain advantages over conventional prior art control panels. For example, by utilizing a continuous printing process from a roll of flexible material, significant cost reductions are attained. Next, the use of polycarbonate plastic provides a very durable exterior surface which is resistive to chemical solvents and thus can be readily cleaned. Further, the polycarbonate plastic is heat resistant.

Accordingly, there has been disclosed an improved construction for a touch sensitive control panel and a method of manufacture thereof. It is understood that the above-described embodiment is merely illustrative of the application of the principles of this invention. Numerous other embodiments may be devised by those skilled in the art without departing from the spirit and scope of this invention, as defined by the appended claims.

I claim:

1. A control panel of the type having a plurality of touch sensitive areas in proximate relationship to corresponding functional indicia, said control panel comprising:
   a non-conductive support member having a surface;
   a plurality of regions of conductive material arranged on said support surface;
   means for providing electrical connections to said plurality of conductive material regions;
   an optically transparent graphic display member having a front surface and a rear surface, said rear surface having said functional indicia printed thereon in non-conductive material; and
   adhesive means for adhesively securing said rear surface of said graphic display member to said support surface with said functional indicia in registration with said conductive material regions;
   said graphic display member and said adhesive means forming a dielectric medium in contact with said conductive material regions so as to provide capacitive coupling between selective ones of said conductive material regions and a body portion of an operator touching said front surface of said graphic display member in an area having an overlying relationship to a selected one of said functional indicia visible through said graphic display member.

2. The control panel according to claim 1 wherein said graphic display member is formed from a flexible sheet of polycarbonate plastic.

3. The control panel according to claim 2 wherein said polycarbonate plastic graphic display member has a velvetized texture on said front surface.

4. The control panel according to claim 1 wherein the dielectric medium formed by said graphic display member and said adhesive means has a dielectric constant in the range from about 3.6 to about 4.

5. The control panel according to claim 4 wherein said dielectric medium has a thickness of about 0.006 inch.

6. The control panel according to claim 1 wherein the support member and the conductive material are optically transparent and the non-conductive material with which the functional indicia are printed is optically translucent.

7. A control panel of the type having a plurality of touch sensitive areas in proximate relationship to corresponding functional indicia, said control panel comprising:
   a non-conductive optically transparent support member having a surface;
   a plurality of regions of optically opaque conductive material arranged on said support surface, said regions being printed with removal areas thereof corresponding to said functional indicia;
   means for providing electrical connections to said plurality of conductive material regions;
   an optically transparent protective member having a front surface and a rear surface, said rear surface having areas of color for said functional indicia printed thereon in non-conductive material; and
   adhesive means for adhesively securing said rear surface of said graphic display member to said support surface with said areas of color in registration with said functional indicia;
   said graphic display member and said adhesive means forming a dielectric medium in contact with said conductive material regions so as to provide capacitive coupling between selective ones of said conductive material regions and a body portion of an operator touching said front surface of said graphic display member in an area having an overlying relationship to a selected one of said functional indicia visible through said graphic display member.

8. A method of manufacturing a control panel of the type having a plurality of touch sensitive areas in proximate relationship to corresponding functional indicia, comprising the steps of:
   (a) providing a non-conductive support member having a surface;
   (b) depositing a plurality of regions of conductive material on said support surface;
   (c) providing electrical connection to said plurality of conductive material regions;
   (d) providing an optically transparent graphic display member having a front surface and a rear surface;
   (e) printing said functional indicia in non-conductive material on said rear surface;
   (f) applying a layer of pressure sensitive adhesive material to said rear surface over said non-conductive material;
   (g) placing said graphic display member over said support surface with said functional indicia in registration with said conductive material regions and with said adhesive layer intermediate said graphic display member and said support surface; and
   (h) applying pressure between the front surface of said graphic display member and said support surface so as to adhere said graphic display member to said support member.

9. The method according to claim 8 further including between the steps (f) and (g) the step of:
   hardening said adhesive material to substantially eliminate any tackiness thereof.

10. The method according to claim 9 wherein the step of hardening includes lowering the temperature of said graphic display member.

11. The method according to claim 9 further including between the steps (g) and (h) the step of:
   softening said adhesive material to restore its tackiness.

12. The method according to claim 11 wherein the step of softening includes raising the temperature of said graphic display member.

13. The method according to claim 8 wherein the step of providing a graphic display member includes providing a roll of flexible polycarbonate plastic and the step of printing includes the steps of:
   utilizing a continuous printing process to print a multiple number of graphic display members from said roll; and
   separating said printed roll into individual graphic display members.

* * * * *